United States Patent
Kato et al.

(10) Patent No.: US 9,166,291 B2
(45) Date of Patent: Oct. 20, 2015

(54) ANTENNA DEVICE AND COMMUNICATION TERMINAL APPARATUS

(71) Applicant: Murata Manufacturing Co., Ltd., Nagaokakyo-shi, Kyoto-fu (JP)

(72) Inventors: Noboru Kato, Nagaokakyo (JP); Jun Sasaki, Nagaokakyo (JP); Satoshi Ishino, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 308 days.

(21) Appl. No.: 13/761,195

(22) Filed: Feb. 7, 2013

(65) Prior Publication Data

US 2013/0147675 A1 Jun. 13, 2013

Related U.S. Application Data

(63) Continuation of application No. PCT/JP2011/073054, filed on Oct. 6, 2011.

(30) Foreign Application Priority Data

Oct. 12, 2010 (JP) .................................. 2010-229756
Dec. 8, 2010 (JP) .................................. 2010-273214

(51) Int. Cl.
*H01Q 7/06* (2006.01)
*H01Q 1/38* (2006.01)
*H01Q 9/27* (2006.01)
*H01Q 1/24* (2006.01)
*H01Q 1/40* (2006.01)

(52) U.S. Cl.
CPC ................. *H01Q 7/06* (2013.01); *H01Q 1/243* (2013.01); *H01Q 1/38* (2013.01); *H01Q 1/40* (2013.01); *H01Q 9/27* (2013.01)

(58) Field of Classification Search
CPC .......................... H01Q 1/243; G06K 19/07784
See application file for complete search history.

(56) References Cited

U.S. PATENT DOCUMENTS

| | | | |
|---|---|---|---|
| 3,364,564 A | 1/1968 | Kurtz et al. | |
| 4,794,397 A | 12/1988 | Ohe et al. | |

(Continued)

FOREIGN PATENT DOCUMENTS

| | | | |
|---|---|---|---|
| CA | 2 279 176 A1 | 7/1998 | |
| CN | 101501929 A | 8/2009 | |

(Continued)

OTHER PUBLICATIONS

English translation of NL9100176, published on Mar. 2, 1992.

(Continued)

*Primary Examiner* — Robert Karacsony
(74) *Attorney, Agent, or Firm* — Keating & Bennett, LLP

(57) ABSTRACT

An antenna device includes an antenna coil including a first conductive pattern disposed on a first major surface of a magnetic sheet, a second conductive pattern disposed on a first major surface of a non-magnetic sheet, and an interlayer conductor connecting the first conductive pattern and second conductive pattern. The antenna coil including the first conductive pattern and second conductive pattern defines a spiral or substantially spiral pattern. The antenna device is a resin multilayer structure in which its base body is a laminate of the magnetic layer and non-magnetic layer and the predetermined patterns are disposed inside and outside the laminate.

21 Claims, 11 Drawing Sheets

(56) References Cited

U.S. PATENT DOCUMENTS

| | | |
|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0253726 A1 | 11/2005 | Yoshida et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0015549 A1 | 1/2007 | Hernandez et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0087990 A1 | 4/2008 | Kato et al. |
| 2008/0129606 A1 | 6/2008 | Yanagisawa et al. |
| 2008/0129629 A1* | 6/2008 | Kimura et al. ................ 343/788 |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0272885 A1 | 11/2008 | Atherton |
| 2009/0002130 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1* | 3/2009 | Kato et al. .................... 235/492 |
| 2009/0066466 A1 | 3/2009 | Arimura |
| 2009/0096696 A1 | 4/2009 | Joyce, Jr. et al. |
| 2009/0109034 A1 | 4/2009 | Chen et al. |
| 2009/0109102 A1 | 4/2009 | Dokai et al. |
| 2009/0121955 A1 | 5/2009 | Kubo et al. |
| 2009/0140947 A1 | 6/2009 | Sasagawa et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0284220 A1 | 11/2009 | Toncich et al. |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |
| 2011/0063184 A1 | 3/2011 | Furumura et al. |
| 2011/0186641 A1 | 8/2011 | Kato et al. |
| 2011/0253795 A1 | 10/2011 | Kato |

(56) References Cited

U.S. PATENT DOCUMENTS

FOREIGN PATENT DOCUMENTS

| | | |
|---|---|---|
| CN | 101595599 A | 12/2009 |
| DE | 10 2006 057 369 A1 | 6/2008 |
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 09-093029 A | 4/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-69533 A | 3/1998 |
| JP | 10-069533 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-048152 A | 2/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |

(56) References Cited

FOREIGN PATENT DOCUMENTS

| | | |
|---|---|---|
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-76750 A | 3/2002 |
| JP | 2002-076750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-325013 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-163134 A | 6/2004 |
| JP | 2004-166176 A | 6/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |

(56) References Cited

FOREIGN PATENT DOCUMENTS

| | | |
|---|---|---|
| JP | 2005-192124 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-333244 A | 12/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-013976 A | 1/2006 |
| JP | 2006-13976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-013120 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 U | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-524942 A | 8/2007 |
| JP | 2007-228254 A | 9/2007 |
| JP | 2007-228325 A | 9/2007 |
| JP | 2007-233597 A | 9/2007 |
| JP | 2007-241789 A | 9/2007 |
| JP | 2007-266999 A | 10/2007 |
| JP | 2007-272264 A | 10/2007 |
| JP | 2007-287128 A | 11/2007 |
| JP | 2007-295177 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-027291 A | 2/2009 |
| JP | 2009-27291 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |
| JP | 2009-111986 A | 5/2009 |
| JP | 2009-135166 A | 6/2009 |
| JP | 2009-153166 A | 7/2009 |
| JP | 2009-182630 A | 8/2009 |
| JP | 2009-213169 A | 9/2009 |
| JP | 2009-260758 A | 11/2009 |
| JP | 2009-284182 A | 12/2009 |
| JP | 2010-009196 A | 1/2010 |
| JP | 2010-050844 A | 3/2010 |
| JP | 2010-081571 | 4/2010 |
| JP | 4609604 B2 | 1/2011 |
| NL | 9100176 A | 3/1992 |

(56) References Cited

FOREIGN PATENT DOCUMENTS

| | | |
|---|---|---|
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |

OTHER PUBLICATIONS

English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device", U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.

(56) References Cited

OTHER PUBLICATIONS

Ito: "Wireless IC Device and Method of Detecting Enviornmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Application No. 13/468,058, filed May 10, 2012.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.
Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
Official Communication issued in International Patent Application No. PCT/JP2011/068110, mailed on Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, mailed Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
Dokai et al.: "Wireless IC Device"; U.S. Appl. No. 13/738,143, filed Jan. 10, 2013.
Official Communication issued in International Patent Application No. PCT/JP2011/074009, mailed on Dec. 20, 2011.
Kato et al.: "Electromagnetic-Coupling-Module-Attached Article"; U.S. Appl. No. 13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, mailed on Dec. 20, 2011.
Official Communication issued in International Patent Application No. PCT/JP2011/073490, mailed on Jan. 10, 2012.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed in Mar. 25, 2008.

(56) References Cited

OTHER PUBLICATIONS

Osamura et al.: "Packaging Material With Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in corresponding Chinese Patent Application No. 201180038063.0, mailed on Apr. 3, 2014.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official communication issued in Japanese Application No. 2007-531524, mailed on Sep. 11, 2007
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399, filed Aug. 25, 2008.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.

(56) References Cited

OTHER PUBLICATIONS

Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed Dec. 7, 2010.
Kato: "Wireless IC Device and Coupling Method for Power Feeding Circuit and Radiation Plate"; U.S. Appl. No. 13/325,273, filed Dec. 14, 2011.

\* cited by examiner

ANTENNA DEVICE AND COMMUNICATION TERMINAL APPARATUS

BACKGROUND OF THE INVENTION

1. Field of the Invention

The present invention relates to an antenna device preferably for use in an RFID system or short-range wireless communication system that communicates with partner equipment through an electromagnetic field signal.

2. Description of the Related Art

An antenna device for use in an HF-band communication system, such as Felica (registered trademark) or NFC, is disclosed in Japanese Unexamined Patent Application Publication No. 2002-325013. FIG. 1 is a front view that illustrates the structure of the antenna device described in Japanese Unexamined Patent Application Publication No. 2002-325013.

An antenna coil 30 illustrated in FIG. 1 includes an air-core coil 32 including spirally wound conductors 31 (31a, 31b, 31e, 31d) in a plane on a film 32a and a flat-shaped magnetic core member 33 disposed in the air-core coil 32 so as to be positioned substantially in parallel with the plane of the air-core coil 32. The air-core coil 32 has an opening 32d in which the magnetic core member 33 is disposed. The first terminal 31a and the coupling conductor 31e are coupled to each other with a through hole 32b. The second terminal 31b and the coupling conductor 31e are coupled to each other with a through hole 32c. This magnetic antenna is arranged on a conductive plate 34.

The antenna device in which the magnetic body is disposed in the opening of the antenna coil illustrated in FIG. 1 can control the directivity of the antenna by controlling the distribution of magnetic fields occurring in the antenna coil. Although depending on the surrounding environment (e.g., relationship with the ground and the like), the communication distance mainly toward the axial direction of the magnetic body can be extended.

In such an antenna device, however, because it has a structure in which the antenna coil has an opening in its central portion and a bar-shaped magnetic body (flat-shaped magnetic core member) is disposed in this opening, its manufacturing process is complicated. Thus, the positional accuracy between the magnetic body and the antenna coil is low and the characteristics of an obtained antenna device tend to widely vary. In addition, an adhesive for use in fixing the antenna coil and the plate-shaped magnetic body is needed, and the adhesive may negatively affect the electric characteristics of the antenna device, depending on the type or applied amount of the adhesive.

In addition, because each of the conductors 31 (31a, 31b, 31e, 31d) is disposed in the plane on the film 32a, a gap is present between the conductor 31 and the magnetic core member 33. Thus, there is a problem in that a magnetic flux is reflected on the interface between the magnetic body and a dielectric body (non-magnetic body) and the magnetic-field coupling decreases.

SUMMARY OF THE INVENTION

Preferred embodiments of the present invention provide an antenna device that can be produced by a simple process, has characteristics that do not vary widely, and has satisfactory electric characteristics, and a communication terminal apparatus including the antenna device.

An antenna device according to a preferred embodiment of the present invention includes a plurality of insulator layers including at least a magnetic layer, at least one first conductive pattern, at least one second conductive pattern, an interlayer conductor, and an antenna coil (e.g., a spiral or helical conductive portion other than the magnetic body) with one turn or a plurality of turns. The first conductive pattern has a half-loop shape or a linear shape, includes one or more layers, and is arranged so as to be adjacent to a first major surface of the magnetic layer. The second conductive pattern has a half-loop shape or a linear shape, includes one or more layers, and is arranged so as to be adjacent to a second major surface of the magnetic layer. The interlayer conductor is disposed in the plurality of layers and connects the first conductive pattern and the second conductive pattern. The antenna coil includes the first conductive pattern, the second conductive pattern, and the interlayer conductor.

For example, at least a portion of the first conductive pattern preferably is disposed on the first major surface of the magnetic layer, at least a portion of the second conductive pattern is disposed on a first major surface of a non-magnetic layer, and the first major surface of the non-magnetic layer is in contact with the second major surface of the magnetic layer.

For example, each of the first conductive pattern and the second conductive pattern preferably includes a plurality of half-loop or linear conductive patterns being parallel or substantially parallel with each other, each of the conductive patterns is disposed on a plane, and the antenna coil is spiral when seen from a winding axis direction thereof.

For example, the plurality of layers preferably includes one or more non-magnetic layers arranged so as to be adjacent to the first major surface of the magnetic layer and a plurality of non-magnetic layers arranged so as to be adjacent to the second major surface of the magnetic layer, the first conductive pattern is disposed on the magnetic layer and the non-magnetic layer adjacent to the first major surface of the magnetic layer, and the second conductive pattern is disposed on the non-magnetic layer adjacent to the second major surface of the magnetic layer.

For example, the plurality of layers preferably includes a plurality of magnetic layers, and at least one of the first conductive pattern and the second conductive pattern preferably is disposed on the plurality of magnetic layers.

For example, the antenna device preferably further includes a coupling conductor disposed within a loop defined by the first conductive pattern and the second conductive pattern when the antenna coil is seen in plan view on any one of the plurality of layers, the coupling conductor being electrically coupled to an external ground terminal and isolated from the antenna coil.

For example, the first conductive pattern and the second conductive pattern may preferably have different line lengths.

A communication terminal apparatus according to a preferred embodiment of the present invention includes the antenna device according to one of the preferred embodiments described above, a communication circuit connected to the antenna device, and a casing that houses the antenna device and the communication circuit.

For example, the casing preferably includes an end portion to be directed toward a communication partner, and the antenna device preferably is arranged in a vicinity of the end portion of the casing.

A path length of the first conductive pattern may preferably be longer than a path length of the second conductive pattern, and the antenna device may preferably be arranged such that a side adjacent to the first conductive pattern is directed toward an antenna of a communication partner.

According to various preferred embodiments of the present invention, an antenna device that can be manufactured by a simple process, has characteristics that do not vary widely, and has satisfactory characteristics, and a communication terminal apparatus including the antenna device is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 2A:
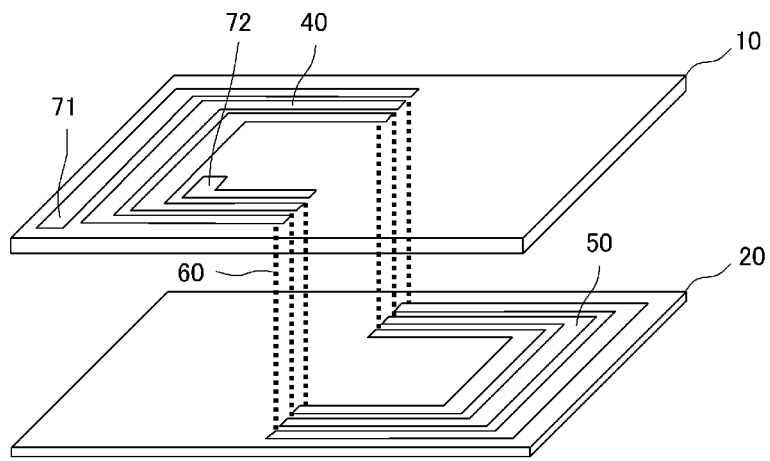
FIG. 2A is an exploded perspective view of an antenna device 101 according to a first preferred embodiment of the present invention.
Figure 2B:
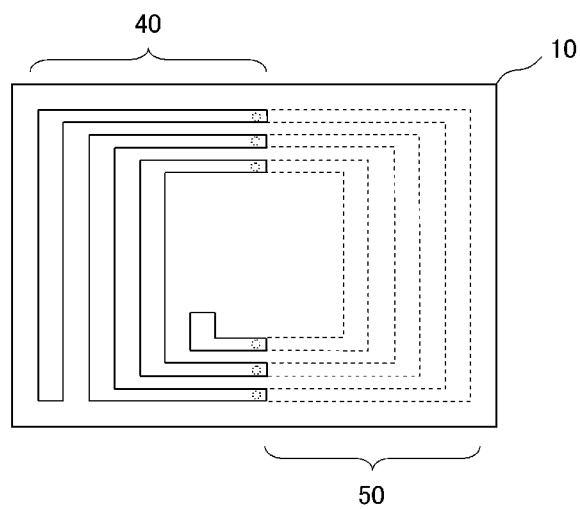
FIG. 2B is a plan view thereof.
Figure 2C:
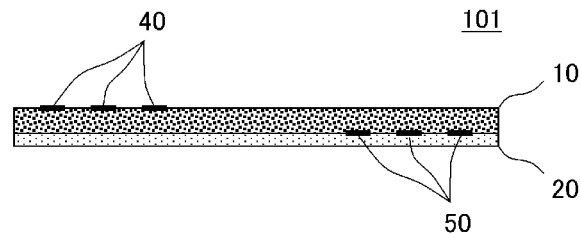
FIG. 2C is a front view thereof.

FIG. 2A is an exploded perspective view of an antenna device 101 according to a first preferred embodiment of the present invention. FIG. 2B is a plan view of the antenna device 101. FIG. 2C is a front view of the antenna device 101.

The antenna device 101 is configured as an antenna device preferably for use in transmitting and receiving high-frequency signals in a high frequency (HF) range, such as 13.56 MHz, for example. As described below, the antenna device 101 is arranged inside a terminal casing of a communication terminal apparatus, such as a cellular phone, for example.

As illustrated in FIGS. 2A-2C, the antenna device 101 includes an antenna coil. The antenna coil includes a first conductive pattern 40 disposed on a first major surface (upper surface in FIGS. 2A-2C) of a magnetic sheet 10, a second conductive pattern 50 disposed on a first major surface (upper surface in FIGS. 2A-2C) of a non-magnetic sheet 20, and an interlayer conductor (via electrode) 60 connecting the first conductive pattern 40 and the second conductive pattern 50. The magnetic sheet corresponds to a "magnetic layer", and the non-magnetic sheet corresponds to a "non-magnetic layer".

The first conductive pattern 40 includes a set of a plurality of half-loop conductive patterns arranged in parallel or substantially in parallel with each other. The second conductive pattern 50 also includes a set of half-loop conductive patterns arranged in parallel or substantially in parallel with each other.

As illustrated in FIG. 2B, the antenna coil including the first conductive pattern 40 and the second conductive pattern defines a spiral or substantially spiral pattern of a plurality of turns (preferably three turns in this example). When seen in plan view (seen from the winding axis direction of the antenna coil), the antenna coil preferably is a rectangular or substantially rectangular spiral pattern.

One terminal of the antenna coil is a first input/output terminal 71, and another terminal thereof is a second input/output terminal 72. These input/output terminals are connected to a feed circuit.

The antenna device 101 is formed preferably by stacking the magnetic sheet 10 with the first conductive pattern 40 formed thereon and the non-magnetic sheet 20 with the second conductive pattern 50 formed thereon and pressing and bonding them. That is, the antenna device 101 includes a laminate of a magnetic layer and a non-magnetic layer as a base body. That is, the antenna device 101 is a resin multilayer structure in which its base is a laminate of a magnetic layer and a non-magnetic layer and predetermined conductive patterns are disposed inside and outside the base. The non-magnetic layer may be a low permeability layer having a relative permeability lower than that of the magnetic layer, or alternatively, may be a dielectric layer (relative permeability $\mu r=1$), as in this example.

The magnetic sheet 10 is a thermoplastic resin sheet in which magnetic powder, such as ferrite, is mixed and dispersed in a thermoplastic resin, such as polyimide or liquid crystal polymer. The first conductive pattern 40 is formed preferably by patterning copper foil or aluminum foil by, for example, etching. The non-magnetic sheet 20 includes a thermoplastic resin sheet, such as one made of a polyimide or liquid crystal polymer, that is, a dielectric sheet. The second conductive pattern 50 is formed preferably by patterning copper foil or aluminum foil by, for example, etching. The interlayer conductor 60 is formed preferably by filling a through hole formed by radiating the magnetic sheet 10 with laser light with conductive paste including fine metallic particles whose principal component is silver or copper. When the magnetic sheet 10 and the non-magnetic sheet 20 are stacked and heated, both sheets are fused together, and simultaneously, the first conductive pattern 40 and the second conductive pattern 50 are electrically connected to each other with conductive paste (metal body after heat treatment) disposed therebetween.

As illustrated in FIG. 2C, the interface between the first conductive pattern 40 and the magnetic sheet 10 and the interface between the second conductive pattern 50 and the magnetic sheet 10 have neither an air layer nor a dielectric layer. Thus, a magnetic flux is not reflected on the interface between the magnetic body and dielectric body, and there are few reductions in the magnetic-field coupling resulting from the reflection.

Because such a resin multilayer antenna device is flexible, it can be attached in the casing of, for example, a communication terminal apparatus or attached even to a curved surface of the casing using an adhesive or double-sided adhesive tape, for example.

Because the magnetic sheet 10 and the non-magnetic sheet 20 are both a sheet mainly including a thermoplastic resin, they can be collectively stacked and pressed and bonded and can be easily integrated using a so-called sheet multilayering process.

Aside from the above-described resin multilayer antenna device, a ceramic multilayer antenna device can also be manufactured. In this case, the first conductive pattern 40 and the interlayer conductor 60 may be formed on a magnetic ceramic green sheet using conductive paste, the second conductive pattern 50 may be formed on a dielectric ceramic green sheet or a low permeability ceramic green sheet that has a relative permeability lower than that of a magnetic ceramic green sheet using conductive paste, and both sheets may be stacked and co-fired.

Figure 3:
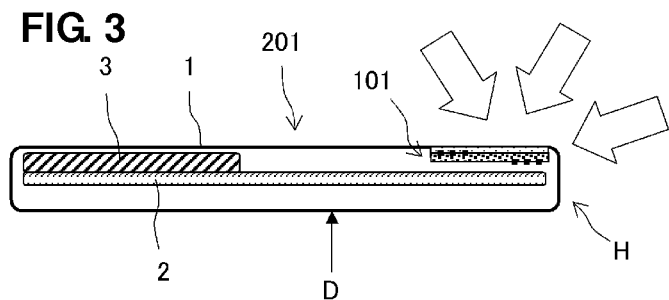
FIG. 3 is a schematic cross-sectional view that illustrates the configuration of a communication terminal apparatus 201 in which the antenna device 101 is incorporated.

FIG. 3 is a schematic cross-sectional view that illustrates the configuration of a communication terminal apparatus 201 in which the antenna device 101 is incorporated. In FIG. 3, the front side (the surface with an input portion/display portion) D of the communication terminal apparatus 201 faces downward. The communication terminal apparatus 201 is configured such that a substrate (printed wiring board) 2, a battery pack 3, the antenna device 101, and other components are incorporated within a casing 1.

As illustrated in FIG. 3, the antenna device 101 is preferably arranged in the vicinity of an end portion H of the casing 1. The non-magnetic sheet (dielectric sheet) 20 of the antenna device 101 is the attaching surface to the casing 1, and the antenna device 101 is attached to the inner bottom surface of the casing 1. That is, the first conductive pattern 40 is arranged so as to be adjacent to the end portion H of the casing 1.

The substrate 2 is provided with a communication circuit. The feed circuit preferably is included in the communication circuit and is connected to the antenna device 101. Contact pins stand on the substrate 2. Each of the input/output terminals of the antenna device 101 and the feed circuit are electrically connected to each other with the contact pins disposed therebetween. The communication terminal apparatus 201 has a predetermined directivity centered in the upper right direction in the drawing and can ensure a long maximum communication distance in this direction.

Second Preferred Embodiment

Figure 4A:
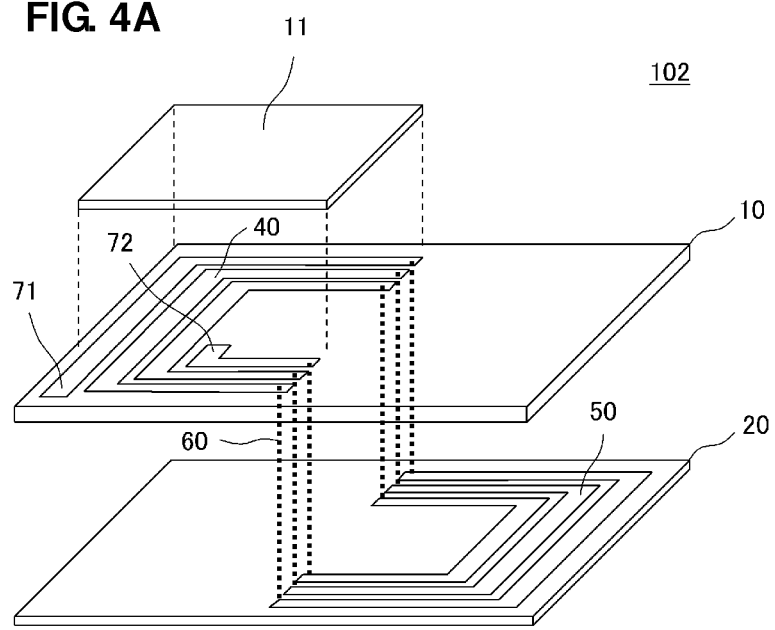
FIG. 4A is an exploded perspective view of an antenna device 102 according to a second preferred embodiment of the present invention.
Figure 4B:
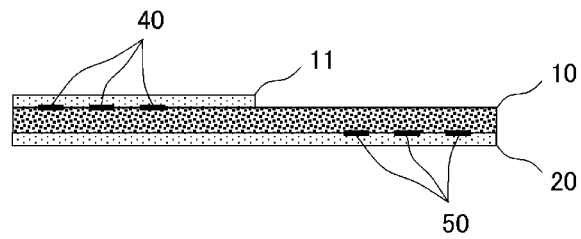
FIG. 4B is a front view thereof.

FIG. 4A is an exploded perspective view of an antenna device 102 according to a second preferred embodiment of the present invention. FIG. 4B is a front view of the antenna device 102. The antenna device 102 is the one in which the antenna device 101 illustrated in the first preferred embodiment further includes a magnetic sheet 11.

The added magnetic sheet 11 is stacked on the first conductive pattern 40 on the first major surface of the magnetic sheet 10 so as to cover a portion of the first conductive pattern 40. The input/output terminal 71, which is one end of the antenna coil, and the input/output terminal 72, which is another end thereof, are exposed.

Figure 5:
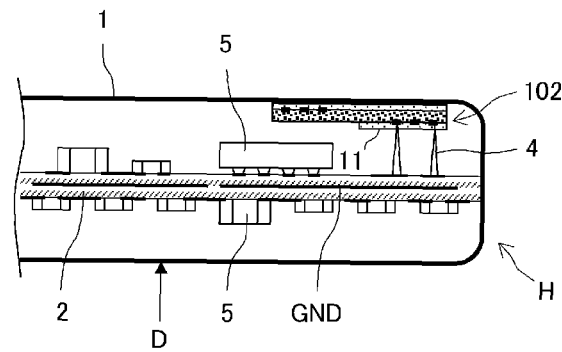
FIG. 5 is a partial cross-sectional view that illustrates the configuration of a communication terminal apparatus 202 in which the antenna device 102 is incorporated.

FIG. 5 is a partial cross-sectional view that illustrates the configuration of a communication terminal apparatus 202 in which the antenna device 102 is incorporated. In FIG. 5, the front side, that is, the surface D with an input portion/display portion of the communication terminal apparatus 202 faces downward. The communication terminal apparatus 202 is configured such that the substrate 2 made of a printed wiring board, the antenna device 102, and other components are incorporated within the casing 1. The substrate 2 is provided with a ground conductor GND. A large number of mounting components 5 is mounted on the front and back sides of the substrate 2.

The antenna device 102 preferably is arranged in the vicinity of the end portion H of the casing 1. The non-magnetic sheet (dielectric sheet) 20 of the antenna device 102 is the attaching surface to the casing 1, and the antenna device 102 is attached to the inner bottom surface of the casing 1. That is, the first conductive pattern 40 is arranged so as to be adjacent to the end portion H of the casing 1. The feed circuit on the substrate 2 and the antenna device 102 are connected to each other preferably with contact pins 4 disposed therebetween, for example.

With such a configuration, the magnetic sheets 10 and 11 are present between the antenna coil in the antenna device 102 and the substrate 2 (more specifically, between the antenna coil and the mounting components 5 and between the antenna coil and the ground conductor GND). Thus, a magnetic field occurring in the antenna coil is not easily subjected to the effects of metal elements, such as the ground conductor GND and the mounting components 5, and the antenna characteristics of the antenna device 102 do not heavily depend on the arrangement situation of peripheral metal elements. Accordingly, stable communication characteristics are obtainable.

Third Preferred Embodiment

Figure 6A:
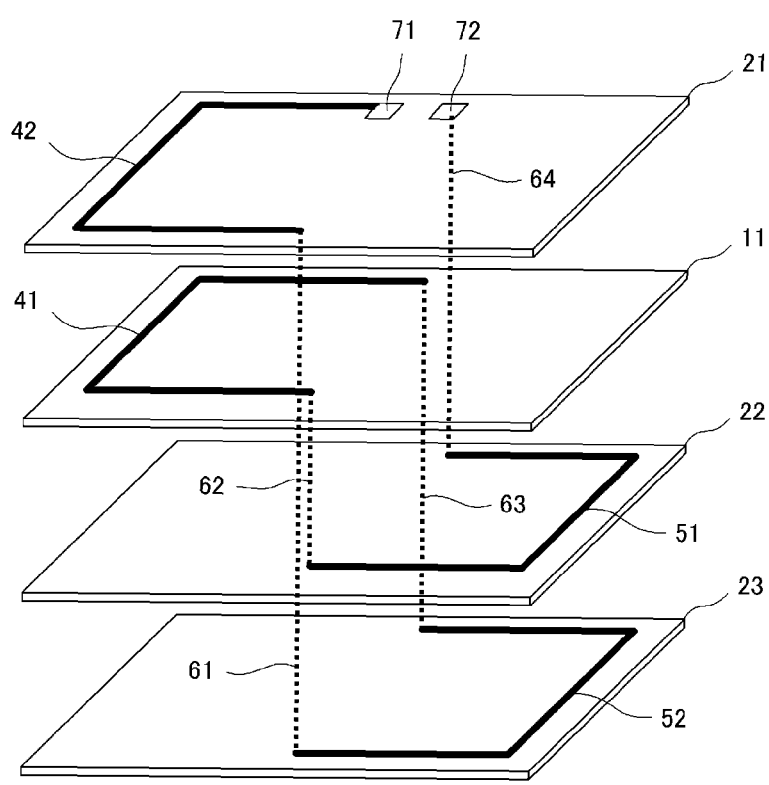
FIG. 6A is an exploded perspective view of an antenna device 103 according to a third preferred embodiment of the present invention.
Figure 6B:
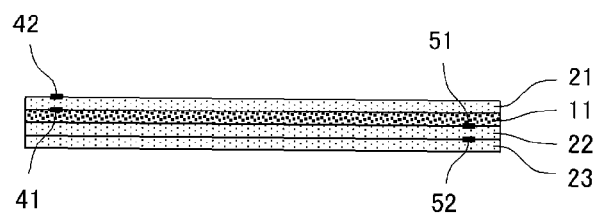
FIG. 6B is a front view thereof.

FIG. 6A is an exploded perspective view of an antenna device 103 according to a third preferred embodiment of the present invention. FIG. 6B is a front view of the antenna device 103. The antenna device 103 includes a plurality of non-magnetic sheets. The first and second conductive patterns in the antenna device 103 are disposed on a plurality of layers. The first and second conductive patterns define a helical or substantially helical antenna coil.

A half-loop first conductive pattern 41 is disposed on the first major surface of the magnetic sheet 11. A half-loop first conductive pattern 42 and the input/output terminals 71 and 72 are disposed on a first major surface of a non-magnetic sheet 21. A half-loop second conductive pattern 51 is disposed on a first major surface of a non-magnetic sheet 22. A half-loop second conductive pattern 52 is disposed on a first major surface of a non-magnetic sheet 23. Interlayer conductors 61 and 64 are disposed in the non-magnetic sheet 21. Interlayer conductors 61, 62, 63, and 64 are disposed in the magnetic sheet 11. The interlayer conductors 61 and 63 are disposed in the non-magnetic sheet 22.

The first conductive patterns 41 and 42, second conductive patterns 51 and 52, interlayer conductors 61 to 64 define a helical or substantially helical antenna coil between the input/output terminals 71 and 72.

Figure 1:
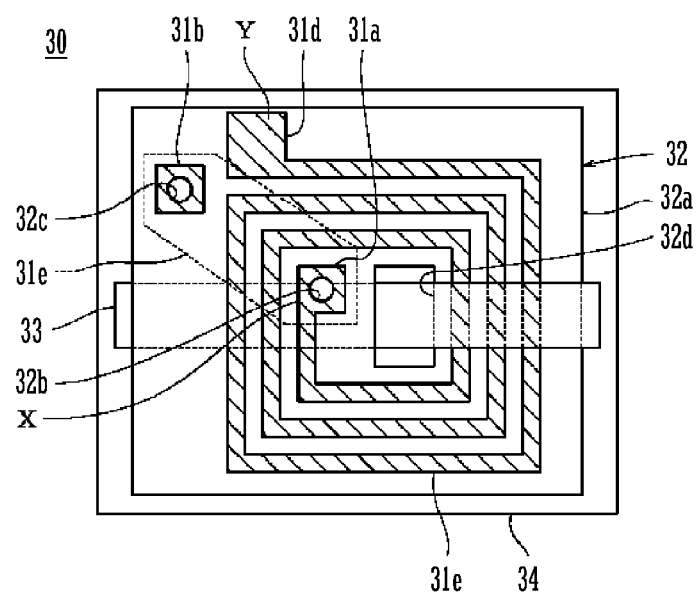
FIG. 1 is a front view that illustrates the structure of an antenna device described in Japanese Unexamined Patent Application Publication No. 2002-325013.

If an antenna device has a structure in which a bar-shaped magnetic body is disposed in an opening of a coil and the antenna coil is a multilayer coil, as in the known example illustrated in FIG. 1, the conductive pattern may be broken when the antenna coil is bent. In contrast, for the structure in the present preferred embodiment, it is not necessary to largely bend the antenna coil, and there is little possibility of a break or damage.

Fourth Preferred Embodiment

Figure 7:
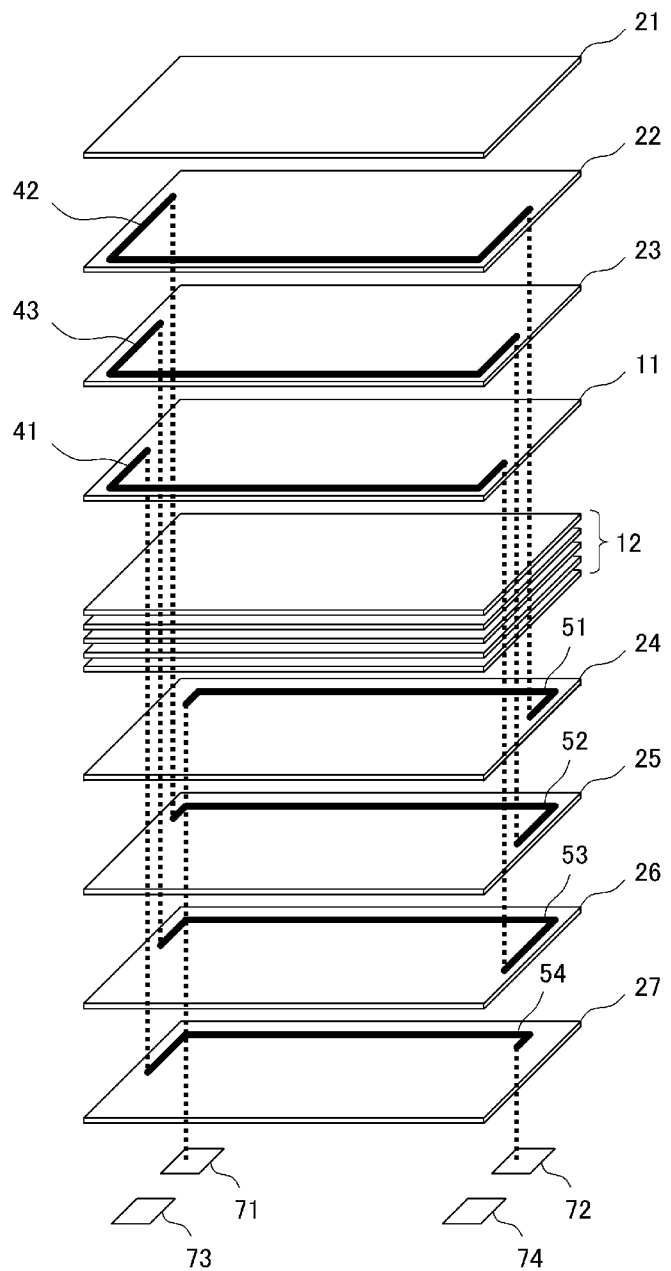
FIG. 7 is an exploded perspective view of an antenna device 104 according to a fourth preferred embodiment of the present invention.

FIG. 7 is an exploded perspective view of an antenna device 104 according to a fourth preferred embodiment. The antenna device 104 includes a plurality of magnetic sheets and a plurality of non-magnetic sheets. The first and second conductive patterns in the antenna device 104 are disposed on a plurality of layers. The first and second conductive patterns define a helical or substantially helical antenna coil.

The half-loop first conductive pattern 41 is disposed on the first major surface of the magnetic sheet 11. No conductive pattern is disposed on the non-magnetic sheet 21. The half-loop first conductive pattern 42 is disposed on the first major surface of the non-magnetic sheet 22. A half-loop first conductive pattern 43 is disposed on the first major surface of the non-magnetic sheet 23. Half-loop second conductive patterns 51, 52, 53, and 54 are disposed on the first major surfaces of non-magnetic sheets 24, 25, 26, and 27, respectively. The input/output terminals 71 and 72 and NC terminals (not electrically connected vacant terminals) 73 and 74 are disposed on the second major surface of the non-magnetic sheet 27.

A plurality of magnetic sheets 12 are stacked between the magnetic sheet 11 and the non-magnetic sheet 24.

Interlayer conductors are disposed in the magnetic sheets 11 and 12 and the non-magnetic sheets 22 to 27.

The first conductive patterns 41 to 43, second conductive patterns 51 to 54, and interlayer conductors define a helical or substantially helical antenna coil between the input/output terminals 71 and 72.

In such a manner, a plurality of magnetic sheets may be stacked and the thickness of the magnetic layers may be increased. That enables the opening of the antenna coil to have a large size, and a high-gain antenna device is obtainable.

Figure 8:
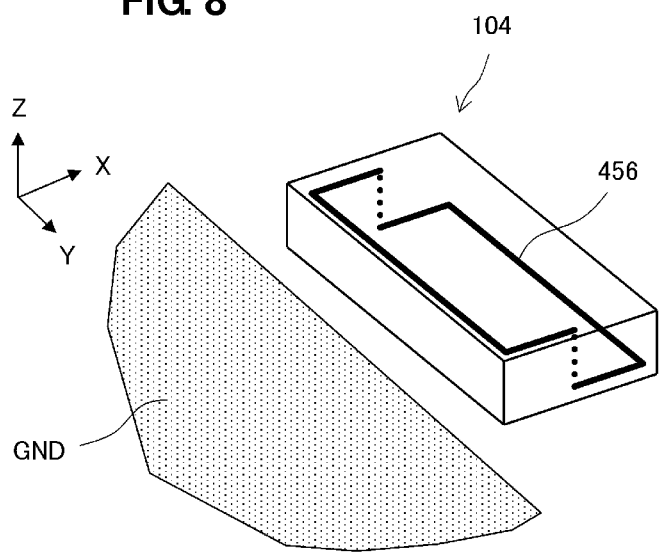
FIG. 8 is a partial perspective view that illustrates the relationship between the antenna device 104 and a ground conductor GND of a substrate.

FIG. 8 is a partial perspective view that illustrates the relationship between the antenna device 104 and the ground conductor GND of the substrate. The above-described helical antenna coil 456 is included in the antenna device 104, and the antenna coil 456 is illustrated in FIG. 8 with a schematic shape. As described in more detail below, preferably the substrate is provided with the ground conductor GND, and the antenna device 104 is mounted in a location remote from the edge of the ground conductor by a predetermined distance in the x-axis direction.

Figure 9A:
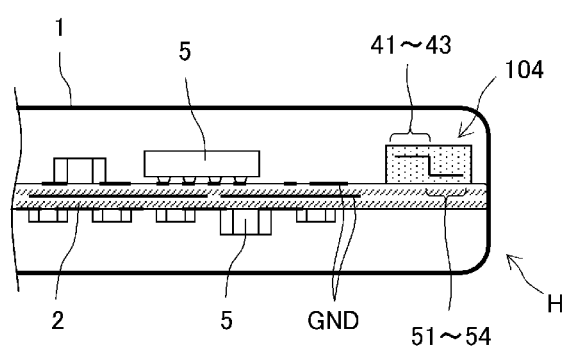
FIG. 9A is a partial cross-sectional view that illustrates the configuration of a communication terminal apparatus 204 in which the antenna device 104 is incorporated.
Figure 9B:
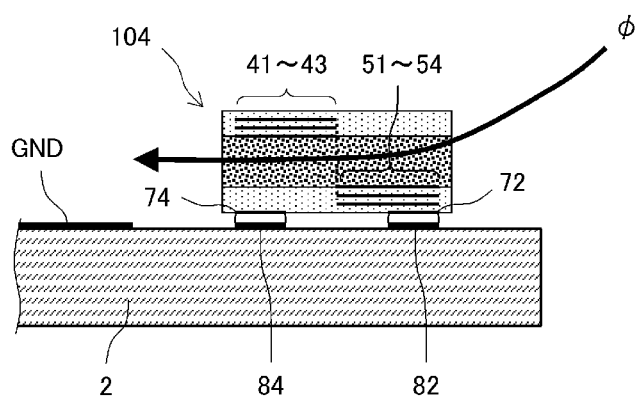
FIG. 9B is an enlarged cross-sectional view of a mounting portion in the antenna device 104.

FIG. 9A is a partial cross-sectional view that illustrates the configuration of a communication terminal apparatus 204 in which the antenna device 104 is incorporated. FIG. 9B is an enlarged cross-sectional view of a mounting portion in the antenna device 104. In FIG. 9A, the front side (input portion/display portion) of the communication terminal apparatus 204 faces downward. The communication terminal apparatus 204 is configured such that the substrate (printed wiring board) 2, the antenna device 104, and other components are incorporated within the casing 1. The substrate 2 is provided with the ground conductor GND. The large number of mounting components 5 is mounted on the front and back sides of the substrate 2.

The input/output terminals 71 and 72 and NC terminals 73 and 74 of the antenna device 104 are connected to input/output lands and NC lands of the substrate 2, respectively, with a binder, such as solder. In FIG. 9B, one input/output land 82 and one NC land 84 are illustrated.

As illustrated in FIG. 9A, the antenna device 104 is arranged in the vicinity of the end portion H of the casing 1. The antenna device 104 is arranged such that the second conductive patterns 51 to 54 face the substrate 2 and are positioned in the vicinity of the end portion H of the casing 1. Thus, a magnetic flux φ enters between the first conductive patterns 41 to 43 and the second conductive patterns 51 to 54 (into the opening of the antenna coil) and, as in the case of the communication terminal apparatuses illustrated in the first and second preferred embodiments, the directivity characteristic directed from the direction of the end portion of the communication terminal apparatus toward the lower surface (the surface opposite to the surface with the input portion/display portion) is obtainable.

For example, the antenna device 104 can be made of a chip laminate having a length of about 5 mm in the X direction, a length of about 10 mm in the Y direction, and a length of about 0.5 mm in the Z direction and can be configured as a surface-mount device (SMD) that is mountable on the printed wiring board in the casing. The antenna coil 456 including the first conductive patterns 41 to 43 and the second conductive patterns 51 to 54 is wound such that the opening of the antenna coil 456 faces a side in the Y direction, as illustrated in FIG. 8. That is, of the base body preferably having a rectangular or substantially rectangular parallelepiped shape, the opening of the antenna coil is positioned in the long-side direction, and that can increase the size of the opening of the antenna coil and can increase the area where the magnetic flux can be picked up. Accordingly, a high-gain antenna device can be provided.

Fifth Preferred Embodiment

Figure 10:
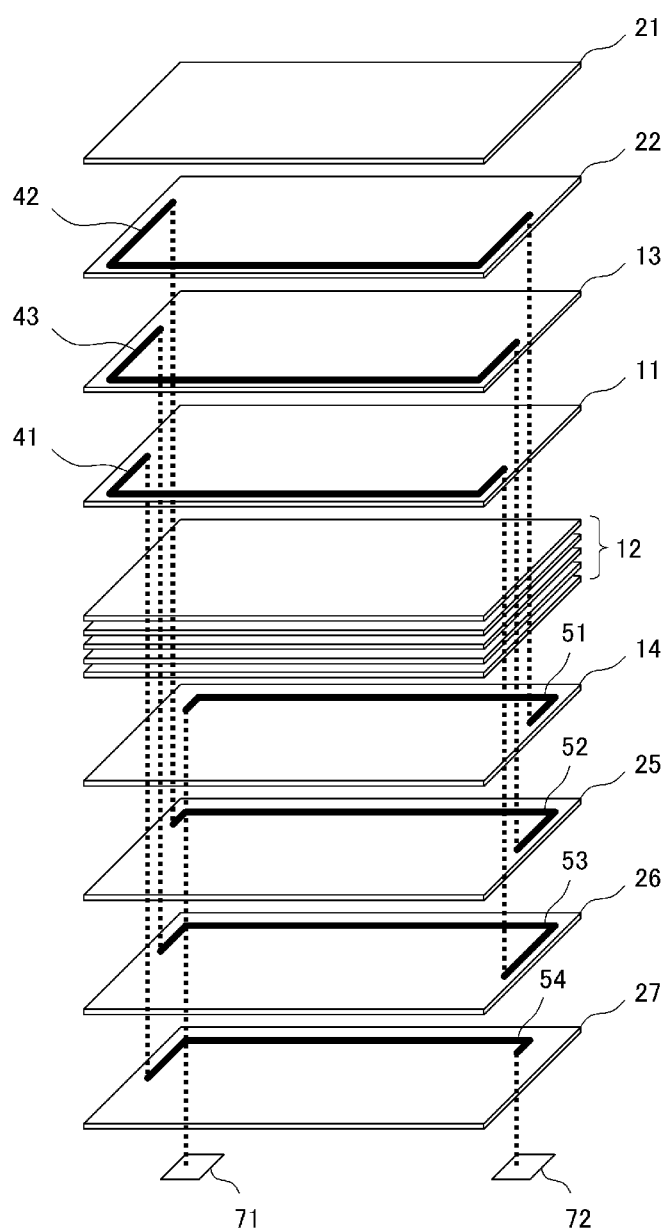
FIG. 10 is an exploded perspective view of an antenna device 105 according to a fifth preferred embodiment of the present invention.

FIG. 10 is an exploded perspective view of an antenna device 105 according to a fifth preferred embodiment of the present invention. The antenna device 105 includes a plurality of magnetic sheets and a plurality of non-magnetic sheets. The first and second conductive patterns in the antenna device 105 are disposed on a plurality of layers. The first and second conductive patterns define a helical or substantially helical antenna coil. Unlike the antenna device 104 illustrated in FIG. 7, the first conductive pattern 43 is disposed on a magnetic sheet 13, and the second conductive pattern 51 is disposed on a magnetic sheet 14. The other configuration is preferably the same as that of the antenna device 104.

In the configuration illustrated in FIG. 10, the first conductive pattern 41 is located between the magnetic sheet 11 and the magnetic sheet 13. That is, the first conductive pattern 41 is embedded in the magnetic layers. Similarly, the second conductive pattern 51 is located between the stack of magnetic sheets 12 and the magnetic sheet 14 and embedded in the magnetic layers.

In this manner, an embedded portion of each of the first conductive patterns and the second conductive patterns in the magnetic layers can easily enhance the inductance of the antenna coil using the effect of the high permeability of the magnetic layers. For example, the antenna coil having predetermined inductance can be achieved with a small number of turns. That is advantageous for miniaturization. Of the first conductive patterns and the second conductive patterns, the portion embedded in the magnetic layers does not substantially contribute to magnetic-field radiation. Accordingly, determining which sheets (how many sheets) in the central section of the plurality of stacked sheets are magnetic sheets and determining that the remaining sheets are non-magnetic sheets may be optimally achieved in consideration of the balance between the size and the gain of the antenna device.

Sixth Preferred Embodiment

Figure 11:
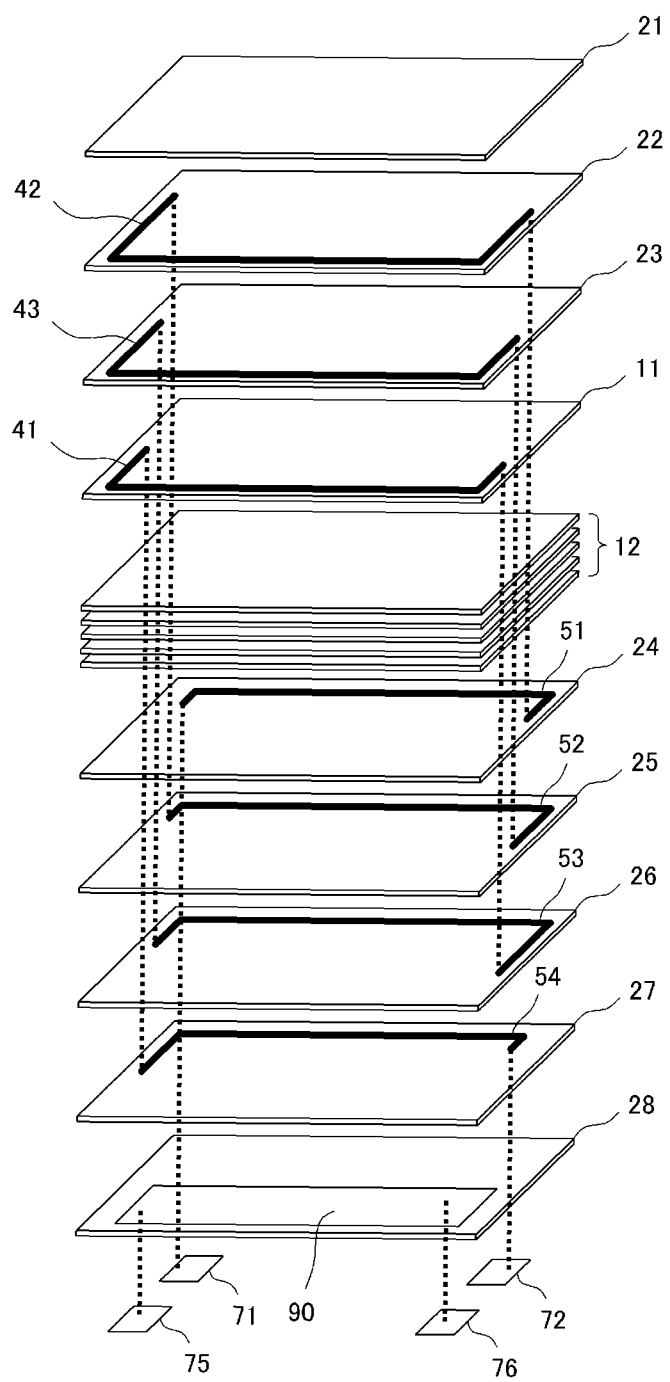
FIG. 11 is an exploded perspective view of an antenna device 106 according to a sixth preferred embodiment of the present invention.

FIG. 11 is an exploded perspective view of an antenna device 106 according to a sixth preferred embodiment of the present invention. The antenna device 106 includes a plurality of magnetic sheets and a plurality of non-magnetic sheets. The first and second conductive patterns in the antenna device 106 are disposed on a plurality of layers. The first and second conductive patterns define a helical or substantially helical antenna coil. Unlike the antenna device 104 illustrated in FIG. 7, a non-magnetic sheet 28 is arranged in the lowermost position. A coupling conductor 90 is disposed on a first major surface of the non-magnetic sheet 28. The coupling conductor 90 may be disposed on the front side of the non-magnetic sheet 24, that front side being the interface with the non-magnetic sheet 12. The input/output terminals 71 and 72 and ground terminals 75 and are disposed on a second major surface of the non-magnetic sheet 28. The ground terminals 75 and 76 are electrically connected to the coupling conductor 90 with the interlayer conductor. The other configuration is the same as that of the antenna device 104.

The coupling conductor 90 is coupled to the antenna coil including the first conductive patterns 41 to 43 and the second conductive patterns 51 to 54 through electromagnetic fields. As described below, connecting the ground terminals 75 and 76 to ground conductors of a substrate on which the antenna device 106 is mounted enables the coupling conductor 90 to act as part of the ground conductors of the substrate or as an extended ground conductor.

Figure 12:
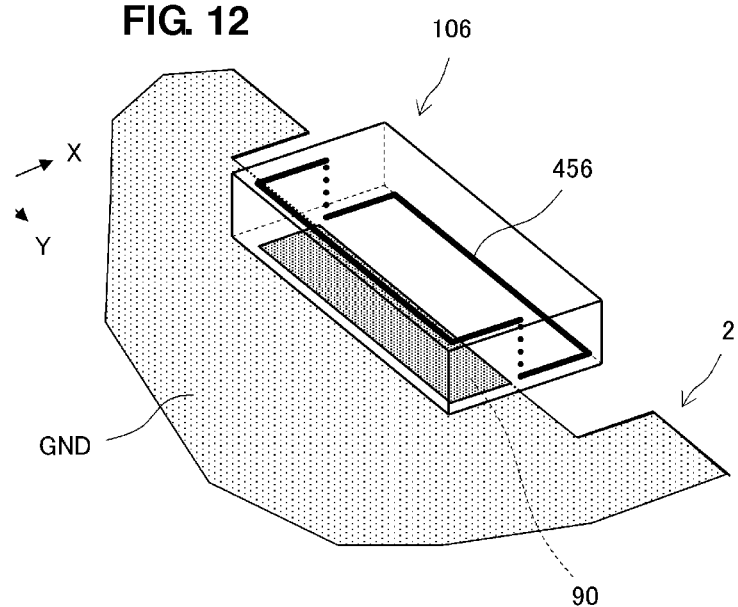
FIG. 12 is a partial perspective view that illustrates the relationship between the antenna device 106 and the ground conductor GND of the substrate.

FIG. 12 is a partial perspective view that illustrates the relationship between the antenna device 106 and the ground conductor GND of the substrate. The helical antenna coil 456 including the first conductive patterns 41 to 43 and the second conductive patterns 51 to 54 is included in the antenna device 106. The antenna coil 456 is illustrated in FIG. 12 with a schematic shape.

The antenna device 106 preferably is mounted in a location projecting from the edge of the ground conductor GND of the substrate 2 by a predetermined dimension in the x-axis direction. In the state where the antenna device 106 is mounted on the substrate 2, the ground conductor GND of the substrate 2 is electrically coupled to the coupling conductor 90 of the antenna device 106.

Figure 13A:
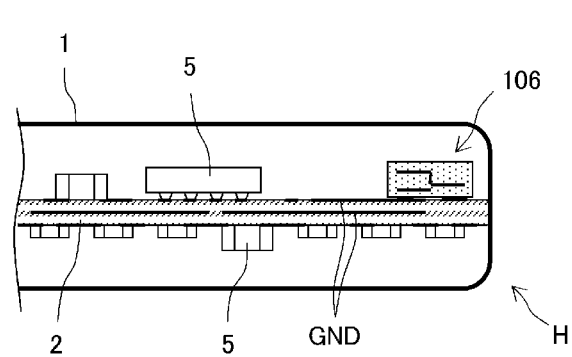
FIG. 13A is a partial cross-sectional view that illustrates the configuration of a communication terminal apparatus 206 in which the antenna device 106 is incorporated.
Figure 13B:
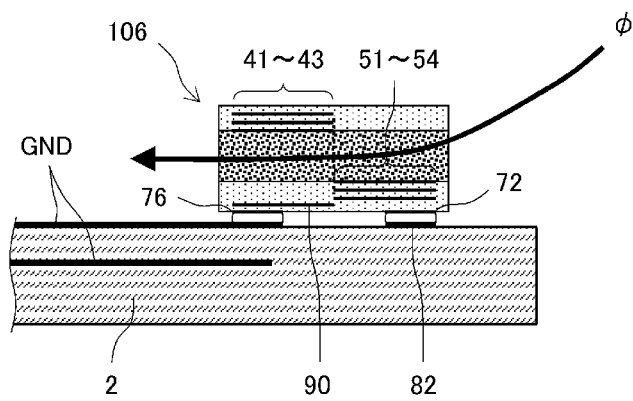
FIG. 13B is an enlarged cross-sectional view of a mounting portion in the antenna device 106.

FIG. 13A is a partial cross-sectional view that illustrates the configuration of a communication terminal apparatus 206 in which the antenna device 106 is incorporated. FIG. 13B is an enlarged cross-sectional view of a mounting portion in the antenna device 106. In FIG. 13A, the front side (input portion/display portion) of the communication terminal apparatus 206 faces downward. The communication terminal apparatus 206 is configured such that the substrate (printed wiring board) 2, the antenna device 106, and other components are incorporated in the casing 1. The substrate 2 is provided with the ground conductor GND. The large number of mounting components 5 is mounted on the front and back sides of the substrate 2.

The input/output terminals 71 and 72 and ground terminals 75 and 76 of the antenna device 106 are connected to the input/output lands and ground conductor GND of the substrate 2, respectively, with a binder, such as solder. In FIG. 13B, one input/output land 82 is illustrated.

Figure 14A:
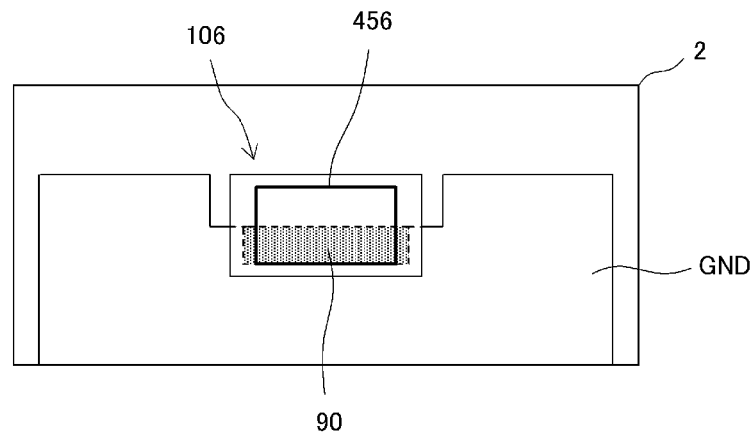
FIG. 14A is a plan view that illustrates the relationship between the antenna device 106 and the ground conductor GND of the substrate.
Figure 14B:
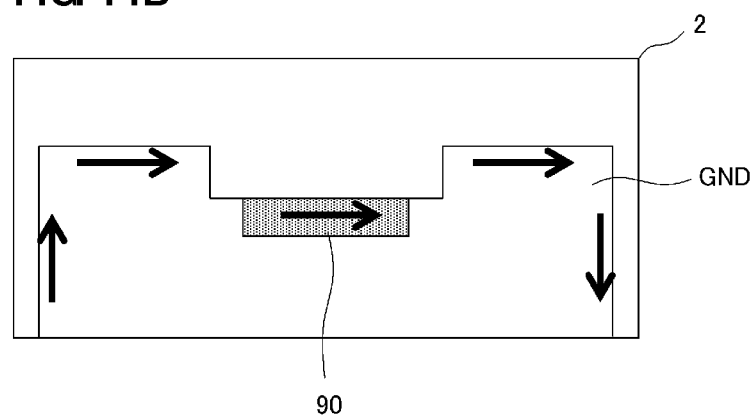
FIGS. 14B and 14C are plan views that illustrate a path of a current flowing in the ground conductor GND and that flowing in an antenna coil 456, respectively.
Figure 14C:
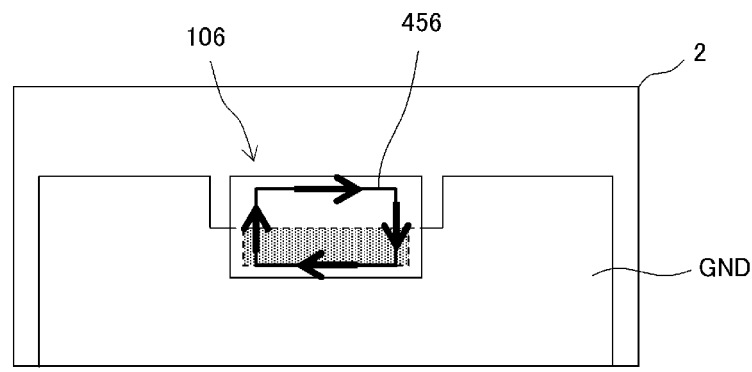

FIG. 14 includes plan views that illustrate the relationship between the antenna device 106 and the ground conductor GND of the substrate and a path of a current flowing in the ground conductor GND or that in the antenna coil 456. FIG. 14A illustrates the positional relationship between the antenna coil 456 and the coupling conductor 90 in the antenna device 106. FIG. 14B illustrates a path of a current flowing in the ground conductor GND of the substrate 2. FIG. 14C illustrates a path of a current flowing in the antenna coil 456.

The antenna device 106 can also pick up an induced current flowing in the ground conductor GND, as illustrated in FIG. 14B, in addition to operating as in the antenna device 104 illustrated in the fourth preferred embodiment. That is, when an induction field from an antenna device of a communication partner impinges on the ground conductor GND, an induced current flows in the ground conductor GND, as indicated by the arrows illustrated in FIG. 14B, and this induced current converges on the edge of the ground conductor GND because of edge effects. Because the coupling conductor 90 of the antenna device 106 is connected to the edge of the ground conductor GND, the current flowing in the edge of the ground conductor GND is also guided to the coupling conductor 90. The current having flowed in the coupling conductor 90 flows in the antenna coil 456 over electromagnetic fields (specifically, the coupling conductor 90 and the first conductive patterns 41 to 43 are coupled over magnetic fields), this current is extracted as a signal current.

Although depending on the distance between the ground conductor GND and the antenna coil 456, when the antenna device 106 is seen in plan view, the antenna coil 456 may be arranged such that all the antenna coil 456 overlaps the ground conductor GND in the range where the antenna coil 456 is not included in the region of the ground conductor GND.

To use an induced current flowing in the ground conductor GND of the substrate 2, the coupling conductor 90 is optional. However, in the state where the ground terminals 75 and 76 are connected to the ground conductor GND of the substrate on which the antenna device is mounted, the coupling conductor 90 acts as part of the ground conductor of the substrate or as an extended ground conductor. Thus, the substantial edge of the ground conductor GND of the substrate 2 in the x-axis direction depends on the coupling conductor 90. Because the coupling conductor 90 preferably is integrally formed in advance in the antenna device 106, even if the accuracy of mounting the antenna device 106 on the substrate 2 is low, the positional relationship between the antenna coil in the antenna device 106 and the substantial edge of the ground conductor GND in the x-axis direction is constant. As a result, stable antenna characteristics that are not affected by the accuracy of mounting the antenna device are obtainable.

Seventh Preferred Embodiment

Figure 15A:
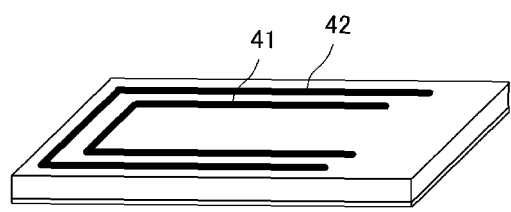
FIG. 15A is a perspective view of an antenna device 107 according to a seventh preferred embodiment of the present invention.
Figure 15B:
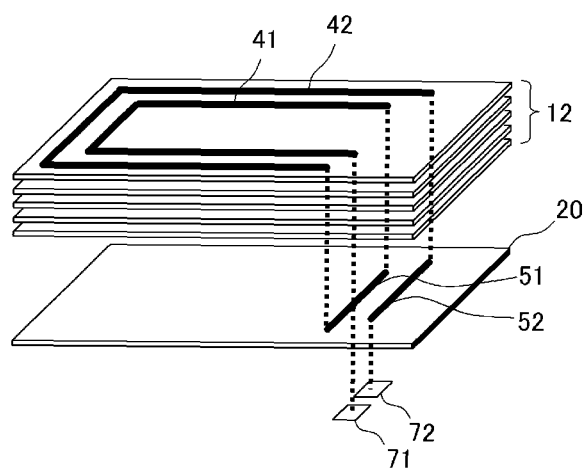
FIG. 15B is an exploded perspective view thereof.
Figure 15C:
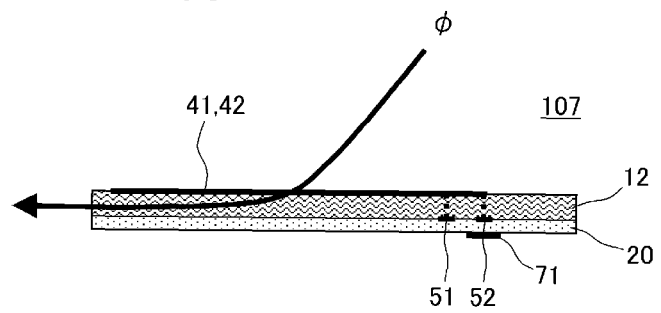
FIG. 15C illustrates how a magnetic flux passes through the antenna device 107.

FIG. 15A is a perspective view of an antenna device 107 according to a seventh preferred embodiment of the present invention, and FIG. 15B is an exploded perspective view thereof. FIG. 15C illustrates how a magnetic flux passes through the antenna device 107. The antenna device 107 includes a plurality of magnetic sheets and a plurality of non-magnetic sheets. The first and second conductive patterns in the antenna device 107 are disposed on a plurality of layers. The first and second conductive patterns define a helical or substantially helical antenna coil.

The half-loop first conductive patterns 41 and 42 are disposed on the first major surface (upper surface in FIGS. 15A-15C) of the plurality of magnetic sheets 12. The second conductive patterns 51 and 52 each having a linear shape are disposed on the first major surface (upper surface in FIGS. 15A-15C) of the non-magnetic sheet 20. The input/output terminals 71 and 72 are disposed on the second major surface of the non-magnetic sheet 20.

The first conductive patterns 41 and 42 and the second conductive patterns 51 and 52 are connected to each other with the interlayer conductors in the magnetic sheets 12 disposed therebetween. The second conductive patterns 51 and 52 and the input/output terminals 71 and 72 are connected to each other with the interlayer conductors in the non-magnetic sheet 20 disposed therebetween.

In that way, the first conductive patterns 41 and 42, the second conductive patterns 51 and 52, and the interlayer conductors define a spiral or substantially spiral antenna coil with two turns between the input/output terminals 71 and 72.

As described above, the line length of each of the first conductive patterns 41 and 42 and the line length of each of the second conductive patterns 51 and 52 may be different. That is, the magnetic body may substantially pass through the opening of the antenna coil in a location displaced from the center of that opening.

In the orientation illustrated in FIG. 15C, an antenna of a communication partner is present above or in an upward slanting direction of the antenna device 107. Thus, the magnetic flux φ enters between the first conductive patterns 41 and 42 and the second conductive patterns 51 and 52 (into the opening of the antenna coil) and exits from the magnetic layers 12 mainly through the end surface. In the example illustrated in FIGS. 15A-15C, the line length of each of the first conductive patterns 41 and 42 is longer than that of each of the second conductive patterns 51 and 52. Thus, the size of the substantial opening of the antenna coil allowing an entry of the magnetic flux φ can be increased as illustrated in FIG. 15C, and the high-gain antenna device is obtainable.

In the above-described examples, an antenna device preferably for use in an HF range that can be used in NFC or the like is described. The antenna device may also be configured as the one for use in a UHF range, such as GSM or DCS.

The antenna device according to the present invention is not limited to a device including a magnetic sheet and a non-magnetic sheet. For example, the antenna device may be configured so as to include a magnetic layer and a non-magnetic layer that are formed by thick film printing.

When the antenna device according to various preferred embodiments of the present invention is attached to the inner surface of the casing, as illustrated in FIGS. 3 and 5, a flexible resin multilayer structure may preferably be used as the base body. When the antenna device according to various preferred embodiments of the present invention is mounted on a substrate (printed wiring board), as illustrated in FIGS. 9A and 9B and FIGS. 13A and 13B, a rigid ceramic laminate that can be mounted by substantially the same process as in other mounting components may preferably be used as the base body.

In the preferred embodiments of the present invention, an example in which a portion of the first and second conductive patterns is preferably in contact with a magnetic sheet is described. However, the present invention is not limited to that arrangement. That is, the first and second conductive patterns may be arranged on only a non-magnetic sheet that is not in direct contact with a magnetic sheet, and these conductive patterns may be connected together using an interlayer conductor that is contiguously disposed in the magnetic sheet and the non-magnetic sheet.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
a plurality of layers including at least a magnetic layer;
at least one first conductive pattern having a half-loop shape or a linear shape, including one or more layers, and being adjacent to a first major surface of the magnetic layer;
at least one second conductive pattern having a half-loop shape or a linear shape, including one or more layers, and being adjacent to a second major surface of the magnetic layer;
an interlayer conductor included in the plurality of layers and connecting the first conductive pattern and the second conductive pattern; and
an antenna coil including one turn or a plurality of turns, and including the at least one first conductive pattern, the at least one second conductive pattern, and the interlayer conductor, wherein
the plurality of layers includes one or more non-magnetic layers adjacent to the first major surface of the magnetic layer and a plurality of non-magnetic layers adjacent to the second major surface of the magnetic layer, the first conductive pattern is disposed on the magnetic layer and the non-magnetic layer adjacent to the first major surface of the magnetic layer, and the second conductive pattern is disposed on the non-magnetic layer adjacent to the second major surface of the magnetic layer.

2. The antenna device according to claim 1, wherein at least a portion of the at least one first conductive pattern is disposed on the first major surface of the magnetic layer, at least a portion of the second conductive pattern is disposed on a first major surface of a non-magnetic layer, and the first major surface of the non-magnetic layer is in contact with the second major surface of the magnetic layer.

3. The antenna device according to claim 1, wherein each of the at least one first conductive pattern and the at least one second conductive pattern includes a plurality of half-loop or linear conductive patterns being parallel or substantially parallel with each other, each of the conductive patterns is disposed on a plane, and the antenna coil defines a spiral when seen from a winding axis direction thereof.

4. The antenna device according to claim 1, wherein the plurality of layers includes a plurality of magnetic layers, and at least one of the at least one first conductive pattern and the at least one second conductive pattern is disposed on the plurality of magnetic layers.

5. The antenna device according to claim 1, further comprising a coupling conductor disposed within a loop defined by the at least one first conductive pattern and the at least one second conductive pattern when seen in plan view on any one of the plurality of layers, the coupling conductor being electrically coupled to an external ground terminal and isolated from the antenna coil.

6. The antenna device according to claim 1, wherein the first conductive pattern and the second conductive pattern have different line lengths.

7. The antenna device according to claim 1, wherein the antenna coil defines a spiral or substantially spiral pattern including a plurality of turns.

8. The antenna device according to claim 7, wherein the spiral or substantially spiral pattern of the antenna coil is a rectangular or substantially rectangular spiral pattern.

9. The antenna device according to claim 1, further comprising an additional magnetic layer stacked on the at least one first conductive pattern on the first major surface of the magnetic layer so as to cover a portion of the at least one first conductive pattern.

10. The antenna device according to claim 9, further comprising a first input/output terminal located at one end of the antenna coil and a second input/output terminal located at another end of the antenna coil, wherein the first and second input/output terminals are exposed from the antenna device.

11. The antenna device according to claim 1, wherein the at least one first and second conductive patterns define a helical or substantially helical antenna coil.

12. The antenna device according to claim 1, wherein:
the at least one first conductive pattern and the at least one second conductive pattern define a helical or substantially helical antenna coil, and
each of the at least one first conductive pattern and the at least one second conductive pattern includes a plurality of half-loop conductive patterns disposed on respective ones of the plurality of magnetic layers.

13. The antenna device according to claim 12, wherein the at least one first conductive pattern is disposed on one of the plurality of magnetic layers, and the at least one second conductive pattern is disposed on another of the plurality of magnetic layers.

14. The antenna device according to claim 12, wherein one of the plurality of non-magnetic layers is arranged at a lowermost position of the plurality of layers, a coupling conductor is disposed on a first major surface of the one of the plurality of non-magnetic layers disposed at the lowermost position, and input/output terminals and ground terminals are disposed on a second major surface of the one of the plurality of non-magnetic layers disposed at the lowermost position.

15. The antenna device according to claim 12, wherein at least two first conductive patterns and at least two second conductive patterns are provided and arranged to define a spiral or substantially spiral antenna coil including at least two turns between input/output terminals.

16. A communication terminal apparatus comprising:
an antenna device;
a communication circuit connected to the antenna device; and
a casing that houses the antenna device and the communication circuit;
the antenna device including:
a plurality of layers including at least a magnetic layer;
at least one first conductive pattern having a half-loop shape and being adjacent to a first major surface of the magnetic layer;
at least one second conductive pattern having a half-loop shape and being adjacent to a second major surface of the magnetic layer;
an interlayer conductor disposed in the plurality of layers and connecting the at least one first conductive pattern and the at least one second conductive pattern; and
an antenna coil including one turn or a plurality of turns, the antenna coil including the at least one first conductive pattern, the at least one second conductive pattern, and the interlayer conductor, wherein
the plurality of layers includes one or more non-magnetic layers adjacent to the first major surface of the magnetic layer and a plurality of non-magnetic layers adjacent to the second major surface of the magnetic layer, the first conductive pattern is disposed on the magnetic layer and the non-magnetic layer adjacent to the first major surface of the magnetic layer, and the second conductive pattern is disposed on the non-magnetic layer adjacent to the second major surface of the magnetic layer.

17. The communication terminal apparatus according to claim 16, wherein the casing includes an end portion directed toward a communication partner, and the antenna device is located in an area of the end portion of the casing.

18. The communication terminal apparatus according to claim 16, wherein a path length of the first conductive pattern is longer than a path length of the second conductive pattern, and the antenna device is arranged such that a side adjacent to the first conductive pattern is directed toward an antenna of a communication partner.

19. The communication terminal apparatus according to claim 16, wherein the communication terminal apparatus is a cellular telephone.

20. An antenna device comprising:
a plurality of layers including at least a magnetic layer;
at least one first conductive pattern having a half-loop shape or a linear shape, including one or more layers, and being adjacent to a first major surface of the magnetic layer;
at least one second conductive pattern having a half-loop shape or a linear shape, including one or more layers, and being adjacent to a second major surface of the magnetic layer;
an interlayer conductor included in the plurality of layers and connecting the first conductive pattern and the second conductive pattern;
an antenna coil including one turn or a plurality of turns, and including the at least one first conductive pattern, the at least one second conductive pattern, and the interlayer conductor; and
a coupling conductor disposed within a loop defined by the at least one first conductive pattern and the at least one second conductive pattern when seen in plan view on any one of the plurality of layers, the coupling conductor being electrically coupled to an external ground terminal and isolated from the antenna coil.

21. A communication terminal apparatus comprising:
an antenna device;
a communication circuit connected to the antenna device; and
a casing that houses the antenna device and the communication circuit;
the antenna device including:
a plurality of layers including at least a magnetic layer;
at least one first conductive pattern having a half-loop shape and being adjacent to a first major surface of the magnetic layer;
at least one second conductive pattern having a half-loop shape and being adjacent to a second major surface of the magnetic layer;
an interlayer conductor disposed in the plurality of layers and connecting the at least one first conductive pattern and the at least one second conductive pattern;

an antenna coil including one turn or a plurality of turns, the antenna coil including the at least one first conductive pattern, the at least one second conductive pattern, and the interlayer conductor; and a coupling conductor disposed within a loop defined by the at least one first conductive pattern and the at least one second conductive pattern when seen in plan view on any one of the plurality of layers, the coupling conductor being electrically coupled to an external ground terminal and isolated from the antenna coil.

* * * * *